United States Patent [19]

Ranzanigo

[11] 4,046,449
[45] Sept. 6, 1977

[54] SYSTEM FOR INTERCHANGEABLE ATTACHMENT OF ELECTRICAL EQUIPMENT

[76] Inventor: Pierluigi Ranzanigo, Via Cave 68, Brescia, Italy

[21] Appl. No.: 626,561

[22] Filed: Oct. 28, 1975

Related U.S. Application Data

[63] Continuation of Ser. No. 605,177, Aug. 15, 1975, abandoned, which is a continuation of Ser. No. 428,405, Dec. 26, 1973, abandoned.

[30] Foreign Application Priority Data

Dec. 29, 1972 Italy .................................. 33882/72

[51] Int. Cl.$^2$ ............................................ H01R 13/54
[52] U.S. Cl. ............................... 339/126 R; 339/91 R
[58] Field of Search .................. 339/91 R, 126 R, 128

[56] References Cited

U.S. PATENT DOCUMENTS 3,651,446   3/1972   Sadogierski et al. .............. 339/91 R Primary Examiner—Roy Lake
Assistant Examiner—E. F. Desmond
Attorney, Agent, or Firm—Michael J. Striker

[57] ABSTRACT

A system for interchangeable attachment of electrical equipment carried on an insulating frame to a mounting plate. Electrical equipment carried on an insulating frame can be quickly and easily attached to a mounted plate by a simple snapping action of detents located on the mounting plate into associated cut outs located on an insulating frame. Once attached to the mounting plate, the equipment and the associated insulating frame can only be removed by depressing a resilient plate in which these detents are located with a screwdriver or similar tool.

9 Claims, 5 Drawing Figures

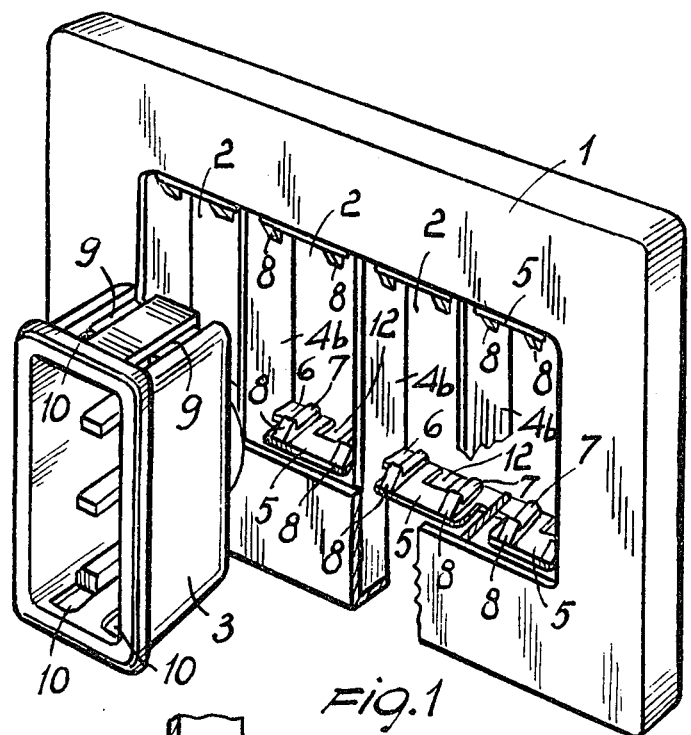
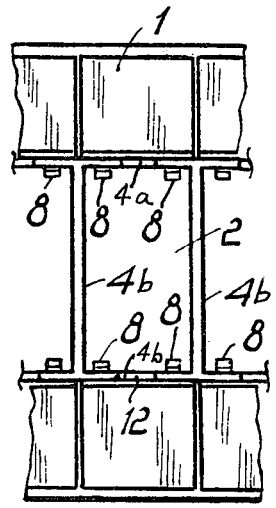
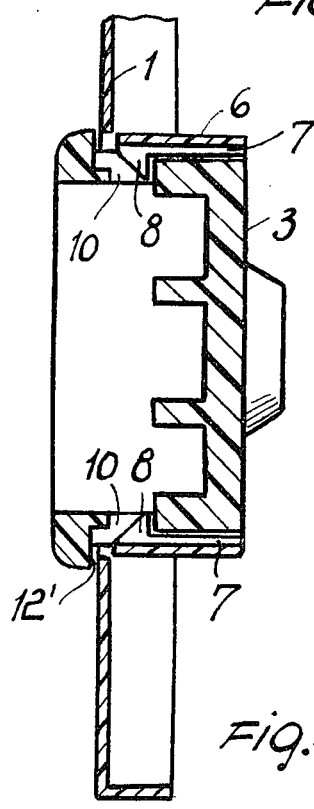
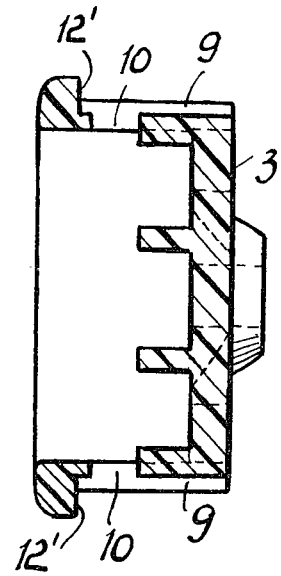
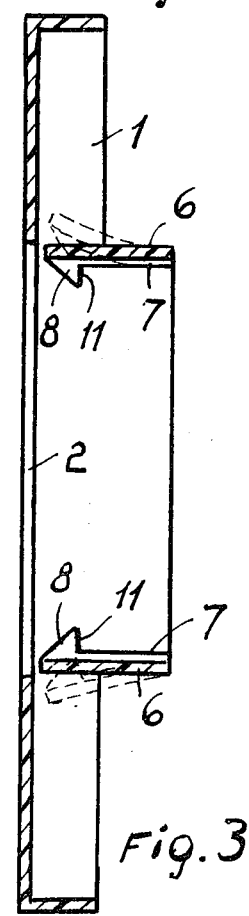

SYSTEM FOR INTERCHANGEABLE ATTACHMENT OF ELECTRICAL EQUIPMENT

This is a continuation of application Ser. No. 605,177, filed Aug. 15, 1975, now abandoned, which in turn is a continuation of application Ser. No. 428,405, filed Dec. 26, 1973, now abandoned.

BACKGROUND OF THE INVENTION

The present invention relates to a system for the easy and secure interchangeable attachment to a mounting plate of electrical equipment carried on the insulating frame.

Means for mounting items of electrical equipment interchangeably on external plates, panels, boards, etc. are known. The electrical equipment is usually enveloped or surrounded by a flexible foil, plate, or plurality of plates, and fitted with special attachment means such as penetrating clamps or teeth, for mounting the equipment. The front portion of the supporting plate is usually formed with an aperture, through which the electrical equipment passes, and is secured onto the rear portion of the supporting plate by means of these penetrating clamps or teeth, conventionally made of the same material as the flexible plate or plates surrounding the equipment.

The above system has a number of disadvantages. Firstly, when removing the equipment following attachment, the possibility of actually removing the electrical equipment from its supporting means may be hampered primarily because the special attachment means may not unlock properly. Sockets may for example be ripped off their supporting means, when attempting to remove equipment having a plug plugged into such a socket. Moreover, the flexible foil or plate represents an additional cost element, and requires expenditure of additional manhours during the process of installation.

An even greater risk occurs when the flexible foil or plate or plates used are metallic, and therefore subject to accidental contact with live detached leads, which increase the risk of short circuits.

It is an object of the present invention to remove these cited disadvantages by making use of a special insulating frame carrying the equipment, which is removably inserted into a mounting plate, and is easily removable from the latter.

SUMMARY OF THE INVENTION

The invention relates to an arrangement for the interchangeable attachment to a mounting plate of electrical equipment in an insulating frame. The mounting plate is made of an electrically insulating material and has a front aperture and a receiving cavity behind this aperture. The insulating frame has a compartment provided with an open front side and bounded by top, bottom and side walls. This frame is dimensioned to be matingly received in the cavity and in the aperture of the mounting plate. The electrical equipment is located in this compartment. Grooved recesses are formed on the frame, which recesses extend normal to the open side from the rear side of the insulating frame. Flexible detent means are provided in the cavity of the mounting plate in positions corresponding to those of the grooved recesses on the frame. These detent means keep the frame in position, when it is inserted into the cavity of the mounting plate. These detent means are on a resilient plate within the mounting plate and snap into corresponding recesses in the insulating frame, when the latter is inserted into an aperture of the mounting plate. The insulating frame carrying the electrical equipment can be detached by disengaging the resilient detent portions with a suitable tool, such as a screwdriver, and thus releasing the detent portions from engagement with these recesses and making it possible to withdraw the insulating frame from the mounting plate in a direction opposite to the direction of insertion of the former into the latter. A variety of items of electrical equipment located on an insulating frame can thus be easily, securely and removably attached to a mounting plate.

The novel features which are considered as characteristic for the invention are set forth in particular in the appended claims. The invention itself, however, both as to its construction and its method of operation, together with additional objects and advantages thereof, will be best understood from the following description of specific embodiments when read in connection with the accompanying drawings.

BRIEF DESCRIPTION OF THE DRAWINGS

FIG. 1 is a perspective view of the novel arrangement, with some portions broken away;

FIG. 2 is a rear-elevational view of part of the mounting plate of the arrangement in FIG. 1;

FIG. 3a is a somewhat diagrammatic vertical section through the insulating frame of FIG. 1;

FIG. 3b is a view similar to FIG. 3a, but of the mounting plate of FIG. 1; and

FIG. 4 is a somewhat diagrammatic section, showing the components of FIGS. 3a and 3b in connected condition.

DESCRIPTION OF THE PREFERRED EMBODIMENTS

The present invention overcomes the previously cited disadvantage of the prior art by providing detent portions of a mounting plate which snap into corresponding recesses in an insulating frame made of synthetic plastic material and carrying electrical equipment. The frame can be removably inserted into the mounting plate. The mounting plate is provided with an aperture having at least one resilient plate located on one side of the aperture which is substantially parallel with the direction of insertion of the insulating frame into the mounting plate. Detent portions and additional guiding ribs are mounted on each resilient plate; the insulating frame is provided with corresponding recesses or grooves. During the initial stage of insertion of the insulating frame into the mounting plate, the detent portions slide along these grooves, but are forced to move backwards out of the plane of these grooves, since the grooves are not deep enough. Guiding portions mounted behind the detent portions of the resilient plates facilitate insertion of the insulating frame into the mounting plate, and subsequent guidance therein. The grooves terminate in cutouts, the detent portions snapping into these cutouts, which action completes the insertion of the insulating frame into the mounting plates. A single insulating frame or a plurality of insulating frames can be inserted into a single mounting plate which is provided with a single aperture or a plurality of apertures respectively.

As the detent portions are forced backwards out of the plane of the grooves during the process of insertion, the resilient plates are forced to move backwards also.

When the detent portions have snapped into the respective cutouts, they are substantially impeded from any further motion in either the direction of insertion, or in a direction opposed to it, since they abut different respective portions of the insulating frame in a direction transverse to the direction of insertion in that position. The very resilience of the resilient plate on which the detent portions are mounted prevents the latter from snapping out from the cutouts on which they are engaged, in that transverse direction so that the mounting frame is irreversibly locked to the mounting plate.

Removal of the insulating frame from the mounting plate can only occur if the resilient plates, carrying the detent portions, are moved backwards, for example by a tool, such as a screwdriver, thus releasing the detent portons from their respective cutouts, and permitting the insulating frame to be slid out from the mounting plate. The arrangement described above does not necessitate a very precise shape of the detent portions; if the longitudinal dimension of the cutout is somewhat greater than the longitudinal dimension of the detent portion, it will only result in some permissible longitudinal play of the insulated frame inserted into the mounting plate. The dimension of the detent portion transverse to the direction of insertion of the frame into the mounting plate is not too critical either, since the detent portion is urged into the cutout by the resilience of the resilient plate, and cannot, therefore snap out in that transverse direction either. Since several detent portions may be mounted on a single resilient plate, movement of the resilient plate in a direction tending to release the detent portion from engagement in the respective cutouts will release all detent portions mounted on that resilient plate from engagement with the respective cutout portions simultaneously.

Referring now to FIG. 1, mounting plate 1, which may be a separate component or form a part of a panel or board, or of an item of similar nature, will be seen to be formed with multiple apertures 2. Each aperture 2 is intended for mounting one or more electrical devices or items of equipment attached to insulating frame 3. The electrical device or equipment can take the form of a switch, commutator, push-button, socket, warning lamp, electric bell, fuseholder or similar apparatus. Behind each aperture 2 a cavity is provided by two short sides 4a and two long sides forming sidewall portions 4b, the latter being integral with the mounting plate 1.

The individual apertures 2 are separated from each other by these sidewall portions 4b, the thickness of which is determined both by the requirements of desired insulating properties and ease of moulding. Since these sidewall portions 4b can usually be rather thin, the corresponding insulating frames 3 carrying the electrical devices can be spaced rather closely within the mounting plate.

Each aperture 2 is also provided with resilient plates 5, which are attached to aperture 2 in a direction substantially normal to both sidewall portions 4b and the general plane of mounting plate 1. Projecting portions 6 project from resilient plates 5, each projecting portion being integral with each respective sidewall portion 4b. Since sidewall portions 4b have a certain elasticity, they can give way if each insulating frame is not initially fully aligned during the initial insertion process with each corresponding aperture.

Detent portions 8 will be seen to be mounted towards the front of, and upon resilient plates 5. Immediately behind detent portions 8 there are located guiding ribs 7, which assist in guiding insertion of the insulating frame 3 into its associated aperture 2.

Insulating frame 3 will be seen to be provided with recesses or grooves 9, each recess or groove corresponding to an associated detent portion 8 and guiding rib 7 located within the cavity behind the aperture 2 of mounting plate 1. Grooves 9 are parallel with the direction of insertion of insulating frame 3 into aperture 2, and are also parallel with each other. Each groove 9 terminates in a cutout 10, located on the side of insulating frame 3 remote from the side which is initially inserted into aperture 2.

Detent portions 8, particularly as seen on FIGS. 3b and 4, will be seen to be formed with an edge portion 11, one side of which forms a right, or acute angle with the nearer side of guiding rib 7. This particular design ensures a positive locking of detent portions 8 to cutouts 10, and insulating frame 3 cannot therefore be accidentally loosened from mounting plate 2, once it has been inserted into the latter. Obviously the edge 10' of the cutouts 10 will show a plane parallel to the portion 11.

When an electrical device or item of equipment located on an insulating frame 3 is to be mounted on mounting plate 1, it is merely necessary to insert the appropriate frame 3 into the corresponding front portion of aperture 2, and then to push it in completely. During this insertion process, detent portions 8 will enter grooves 9, followed by guiding ribs 7, thus providing additional guidance to frame 3. Detent portions 8 will, however, force resilient plate 5 to move backwards towards the bottom wall of aperture 1, since grooves 9 are not sufficiently deep to completely accommodate detent portions 8 without such a movement. Once insertion has been completed, peripheral flange 12' of frame 3 will come to rest against the front wall of plate 1, as shown in FIG. 4, detent portions 8 having entered cutouts 10, and the frame 3 is thus irreversibly locked to mounting plate 1 unless a tool is employed for its release.

If it is desired to disconnect frame 3 from mounting plate 1 it will be sufficient to move resilient plate 5 backwards away from the center of aperture 2; such movement can be effected by a suitable tool, such as a screwdriver or the like, which is inserted into notch 12, seen towards the rear of resilient plate 5 in FIG. 1. This will disengage detent portion 8 from a corresponding cutout 10, and frame 3 can then be removed effortlessly from mounting plate 1.

While the invention has been illustrated and described as shown in the embodiments illustrated in FIGS. 1-4, it is not intended to be limited to the details shown, since various modifications and structural changes may be made without departing, in any way from the spirit of the present invention.

Without further analysis, the foregoing will so fully reveal the gist of the present invention that others can by applying current knowledge readily adapt it for various applications without omitting features that, from the standpoint of prior art, fairly constitute essential characteristics of the generic or specific aspects of this invention and, therefore, such adaptations should and are intended to be comprehended within the meaning and range of equivalence of the following claims.

What is claimed as new and desired to be protected by Letters Patent is set forth in the appended claims.

1. A system for interchangeable mounting of electrical equipment, comprising a mounting plate having a front and rear surface and bounding an aperture extending between said surfaces; at least one item of electrical equipment including an electrically insulating frame insertable into said aperture in direction from said front to said rear surface; and means for guiding said frame during the insertion thereof and for releasably arresting the same in a fully inserted position thereof, including at least one pair of long and one pair of short walls which are rigid with said mounting plate and extend rearwardly from said rear surface thereof to bound with one another at least one cavity constituting a continuation of said aperture, at least one detent projection rigid with each of said short walls and extending therefrom into said cavity, and at least one pair of elongated grooves on opposite sides of said frame in positions corresponding to those of said detent projections and parallel to said direction of insertion, each of said grooves having a leading guiding portion of a first depth, and a trailing detaining portion of a second depth exceeding said first depth, said short walls being resiliently yieldable to be deflected by said frame upon contact thereof with said detent projections during the insertion so that said detent projections enter said guiding portions of said grooves to guide said frame in said direction of insertion and snap into said detaining portions upon juxtaposition therewith in said fully inserted position to thereby prevent undesired extraction of said frame from said aperture of said mounting plate.

2. A system defined in claim 1, further comprising at least one additional item of electrical equipment having an additional frame identical with said frame; and wherein said guiding and arresting means includes at least one additional pair of said short walls with additional ones of said detent projections and at least one additional long wall parallel to and spaced from one of said long walls, said additional walls bounding with said one long wall an additional cavity adjacent said cavity and constituting an additional continuation of said aperture, said one long wall separating said additional cavity from said cavity, said item and said additional item being interchangeably insertable into said cavity and additional cavity, respectively, through said aperture in said direction and arrestable therein by said detent projections and said additional detent projections, respectively.

3. A system as defined in claim 1, wherein each of said detent projections has a predetermined height from the respective short wall; and wherein said guiding and arresting means further includes a guiding projection associated with each of said detent projections and extending therefrom in said direction and to a height from said respective short wall which is less than said predetermined height, said guiding projection being received in said guiding portion of said groove at least in said fully inserted position.

4. A system as defined in claim 3, wherein said guiding projection has a zone which is received in said guiding portion of said groove prior to reaching said fully inserted position and providing additional guidance for the insertion of said frame.

5. A system as defined in claim 1, wherein said walls are all of one piece with said mounting plate.

6. A system as defined in claim 5, wherein said mounting plate and said walls thereof are of an electrically insulating material.

7. A system as defined in claim 5, wherein said mounting plate and said walls thereof are of a synthetic plastic material.

8. A system as defined in claim 5, wherein said short walls are separated from said mounting plate by cutouts provided at the regions of merger of said short walls with said mounting plate and adjacent said detent projections.

9. A system as defined in claim 8, wherein said cutouts have dimensions as to permit introduction of a tool therein by which said short walls can be deflected to disengage said detent projections from said detaining portions of said groove to permit extraction of said item from said aperture of said mounting plate.

* * * * *